(12) United States Patent
Bertrand et al.

(10) Patent No.: US 6,714,450 B2
(45) Date of Patent: Mar. 30, 2004

(54) WORD PROGRAMMABLE EEPROM MEMORY COMPRISING COLUMN SELECTION LATCHES WITH TWO FUNCTIONS

(75) Inventors: Bertrand Bertrand, Trets (FR); Mohamad Chehadi, Aix en Provence (FR); David Naura, Aix en Provence (FR)

(73) Assignee: STMicroelectronics SA, Montrouge (FR)

( * ) Notice: Subject to any disclaimer, the term of this patent is extended or adjusted under 35 U.S.C. 154(b) by 0 days.

(21) Appl. No.: 10/100,511

(22) Filed: Mar. 18, 2002

(65) Prior Publication Data

US 2002/0163832 A1 Nov. 7, 2002

(30) Foreign Application Priority Data

Mar. 19, 2001 (FR) .............................. 01 03659

(51) Int. Cl.[7] .......................... G11C 16/08; G11C 16/24
(52) U.S. Cl. ......................... 365/185.08; 365/185.23; 365/230.08; 365/230.06
(58) Field of Search ....................... 365/185.08, 189.05, 365/230.08, 230.06, 185.11, 185.23

(56) References Cited

U.S. PATENT DOCUMENTS

| 5,341,334 A | 8/1994 | Maruyama ............. 365/189.11 |
| 5,363,330 A | 11/1994 | Kobayashi et al. ......... 365/185 |
| 5,592,415 A | * 1/1997 | Kato et al. ............. 365/185.01 |
| 6,178,115 B1 | * 1/2001 | Shibata et al. ......... 365/185.03 |

FOREIGN PATENT DOCUMENTS

EP           0155709        9/1985      ........... G11C/17/00

* cited by examiner

*Primary Examiner*—Michael S. Lebentritt
*Assistant Examiner*—J. H. Hur
(74) *Attorney, Agent, or Firm*—Allen, Dyer, Doppelt, Milbrath & Gilchrist, P.A.; Lisa K. Jorgenson

(57) ABSTRACT

An electrically programmable and erasable memory includes memory cells connected to word lines and to bit lines arranged in columns. Bit lines selection transistors are driven by bit lines selection signals. Column selection latches each includes a locking element for a column selection signal and a circuit for delivering a gate control signal which depends on the output of the locking element. Each column selection latch delivers, in addition to a gate control signal, a bit lines selection signal. This signal depends on the output of the locking element at least during programming and reading phases of the memory cells.

29 Claims, 6 Drawing Sheets

WORD PROGRAMMABLE EEPROM MEMORY COMPRISING COLUMN SELECTION LATCHES WITH TWO FUNCTIONS

FIELD OF THE INVENTION

The present invention relates to integrated circuits, and more particularly, to an electrically erasable and programmable and memory (EEPROM).

BACKGROUND OF THE INVENTION

EEPROM devices belong to two categories: page programmable memories and word programmable memories. A word generally represents a byte (8 bits), and a page generally represents a set of words belonging to a same word line. Page programmable memories require a high number of programming latches. More particularly, they require as many programming latches as there are bit lines to ensure a simultaneous programming of all the words of a page. In contrast, word programmable memories require a reduced number of latches, for example, eight programming latches for a byte programmable memory.

FIG. 1 schematically illustrates the conventional architecture of a memory MEM1 of the second type, i.e., one that is programmable by word. The memory comprises word lines $WL_i$, bit lines $BL_j$ arranged in columns $COL_k$, with each illustrated column comprising eight bit lines BL0 to BL7, and memory cells $CE_{i,j}$. The memory cells $CE_{i,j}$ are arranged in an array and are connected to the word lines $WL_i$ and the bit lines $BL_j$.

Each cell $CE_{i,j}$ comprises a floating gate transistor FGT and an access transistor TA. The access transistor TA has its gate G connected to a word line $WL_i$, its drain D connected to a bit line $BL_j$, and its source S connected to the drain D of transistor FGT. Transistor FGT has its gate G coupled to a column selection line $CL_k$ by a gate control transistor $CGT_{i,k}$, and its source S is connected to a source line $SL_i$. The gate of transistor $CGT_{i,k}$ is connected to word line $WL_i$.

Thus, each group of eight cells $CE_{i,j}$ connected to a word line $WL_i$ and to the bit lines BL0 to BL7 of a column $COL_k$ forms a word $W_{i,k}$ that may be selected by the corresponding column selection line $CL_k$ and word line $WL_i$. To this effect, the word lines $WL_i$ are connected to the outputs of a line decoder RDEC. The column selection lines $CL_k$ are connected to latches $LSC_k$ delivering a gate control signal $CGS_k$ which depends on a column selection signal $SEL_k$ received as an input. The selection signal $SEL_k$ is delivered by a column decoder CDEC. Line decoder RDEC and column decoder CDEC receive respectively the most significant bits and the less significant bits of an address AD applied to the memory. Source line $SL_i$ may be brought to a floating potential or may be connected to ground by a transistor SLT driven by a signal SLS.

Memory MEM1 also comprises eight programming latches LP0 to LP7, the outputs of which are connected to lines L0 to L7, and eight sense amplifiers SA0 to SA7, the inputs of which are connected to the lines L0 to L7 by read transistors TR0 to TR7 driven by a signal READ. The outputs of amplifiers SA0 to SA7 and the inputs of latches LP0 to LP7 are connected to a data bus DTB, allowing data read in the memory to be delivered by amplifiers SA0 to SA7 or data to be programmed in the memory to be loaded into programming latches LP0 to LP7.

Lines L0 to L7 are coupled to the bit lines BL0 to BL7 of each column $COL_k$ by a multiplex bus DMB. Each programming latch $LP_j$ of rank j is thus connected to the bit lines of the same rank j present in the columns. To ensure a selective connection of the output of a latch or of the input of a sense amplifier to a predetermined bit line, each bit line BL0–BL7 of each column $COL_k$ is provided with a selection amplifier or transistor TSBL0 to TSBL7. Selection transistors TSBL0 to TSBL7 of the bit lines of a same column $COL_k$ are driven by a common selection signal $BLS_k$, delivered by a latch $LSBL_k$ receiving as an input a column selection signal $SEL_k$ coming from column decoder CDEC.

There can thus be found in each column of rank k of memory MEM1 a column selection latch $LSC_k$ and a bit lines selection latch $LSBL_k$ which are driven by a common column selection signal $SEL_k$ coming from column decoder CDEC. These latches deliver a gate control signal $CGS_k$ and a bit line selection signal $BLS_k$. The values of these signals depend on the current operating phase, that is, erasure, programming or reading of a cell.

An erasing or programming operation of a memory cell includes injecting or extracting electrical charges by the Fowler Nordheim effect in the floating gate of the transistor FGT of the cell. An erased transistor FGT has a positive threshold voltage VT1, and a programmed transistor FGT has a negative threshold voltage VT2.

When a reading voltage Vread between VT1 and VT2 is applied to its gate, an erased transistor remains turned OFF, which corresponds by convention to a logic 1, and a programmed transistor is turned ON, which corresponds by convention to a logic 0. The erasing operation is performed by applying an erasing voltage Vpp on the order of 12 to 20 V to the gate G of transistor FGT while source line $SL_i$ is brought to ground. The programming operation is performed by applying a programming voltage Vpp to the drain D of transistor FGT by an access transistor TA, while its gate is brought to ground.

During an erasing phase of the memory cells of a word $W_{i,k}$, the latch $LSC_k$ and the latch $LSBL_k$ of the concerned column are activated by signal $SEL_k$. Latch $LSC_k$ delivers a gate control signal $CGS_k$ equal to Vpp, and latch $LSBL_k$ delivers a voltage equal to zero (ground). During a programming phase of the memory cells of word $W_{i,k}$, latch $LSC_k$ delivers a voltage equal to zero (ground) and latch $LSBL_k$ delivers voltage Vpp so that the transistors TSBL0 to TSBL7 of the column are turned ON and couple the outputs of the programming latches $LP_j$ to the bit lines of the column. During a reading phase of word $W_{i,k}$, latch $LSC_k$ delivers a reading voltage Vread and latch $LSBL_k$ delivers a voltage Vcc so that the transistors TSBL0 to TSBL7 of the column are turned ON and couple the inputs of the sense amplifiers $SA_j$ to the bit lines of the column. Read transistors $TR_j$ are also turned ON and signal READ is at 1.

As mentioned above, the advantage of such a memory is to have a small number of programming latches, such as the eight latches LP0 to LP7, for example, when a page programmable memory comprises as many programming latches as bit lines. The providing of transistors TSBL0 to TSBL7 is necessary to ensure the connection of a programming latch to a predetermined bit line. The providing of transistors TSBL0 to TSBL7 implies the providing of the latches $LSBL_k$ to drive such transistors.

In other words, the bit line selection latches $LSBL_k$ make it difficult to reduce the number of programming latches, and complicates the structure of the memory. Thus, for example, a word programmable memory comprising 2048 bit lines arranged in 256 columns must be provided with 256 column selection latches and 256 bit lines selection latches. The latches each comprise a locking element of the selection signal $SEL_k$ so that the delivered signals $CGS_k$ and $BLS_k$ remain stable until a reset signal is applied to the latches.

SUMMARY OF THE INVENTION

In view of the foregoing background, an object of the present invention is to simplify the architecture of a EEPROM device. The present invention is based on the observation that the locking element comprised in a column selection latch can be used to generate and/or control the selection signal of the bit lines of the column, in addition to the gate control signal provided for the floating gate transistors.

This and other objects, advantages and features according to the present invention are provided by integrating, in a same latch comprising one locking element only, the column selection function and the bit lines selection function. The latch includes two outputs, one for delivering the gate control signal and the other for delivering the bit lines selection signal.

More particularly, the present invention provides an electrically programmable and erasable memory comprising memory cells connected to word lines and bit lines arranged in columns, bit lines selection transistors driven by bit lines selection signals, and column selection latches comprising each a locking element for a column selection signal and means for delivering a gate control signal which depends on the output of the locking element. Each column selection latch comprises means for delivering, in addition to a gate control signal, a bit lines selection signal which depends on the output of the locking element, at least during programming and reading phases of memory cells.

The column selection latch in the active state may deliver, during programming periods of the memory cells, a gate control signal equal to zero and a bit lines selection signal equal or substantially equal to a programming high voltage.

The column selection latch in the active state may deliver, during erasing periods of the memory cells, a gate control signal equal to an erasing high voltage and a bit lines selection signal equal to zero. Alternatively, the column selection latch in the active state may deliver, during erasing periods of memory cells, a gate control signal equal to an erasing high voltage and a bit lines selection signal equal or substantially equal to the erasing high voltage.

The memory may comprise insulating transistors disposed between the bit lines and outputs of the programming latches. The column selection latch may comprise a switching means having a control terminal connected to the output of the locking element, an input terminal receiving a gate control voltage and an output terminal delivering the gate control signal.

The column selection latch may comprise a conductive track, an end of which is connected to the output of the locking element, and the other end of which delivers the bit lines selection signal. The column selection latch may also comprise a second switching means having a control terminal connected to the output of the locking element, an input terminal receiving a predetermined voltage, and an output terminal delivering the bit lines selection signal.

The column selection latch may comprise an inverting gate electrically supplied with a predetermined voltage, the input of which is connected to a node of the locking element and the output of which delivers the bit lines selection signal. The predetermined voltage may be identical to a supply voltage applied to the locking element. Alternatively, the predetermined voltage may be a voltage equal to zero during erasing phases of memory cells.

The present invention also relates to a method of selecting bit lines in an electrically programmable and erasable memory comprising memory cells connected to word lines and bit lines arranged in columns, bit lines selection transistors driven by bit lines selection signals, and column selection latches. Each column selection latch comprises a locking element of a column selection signal, and means for delivering a gate control signal which depends on the output of the locking element. Each column selection latch, in addition to delivering a gate control signal, includes means for delivering a bit lines selection signal which depends on the output of the locking element, at least during programming and reading phases of the memory cells.

The method may comprise providing, in a column selection latch, a switching means having a control terminal connected to the output of the locking element, an input terminal receiving a predetermined voltage, and an output terminal delivering the bit lines selection signal.

The method may comprise providing, in a column selection latch, an inverting gate electrically supplied with a predetermined voltage, the input of and the output of which delivers the bit lines which is connected to a node of the locking element, selection signal. The predetermined voltage may be chosen identical to a supply voltage applied to the locking element. Alternatively, the predetermined voltage may be a voltage equal to zero during erasing phases of memory cells.

The method further comprises providing insulating transistors disposed between the bit lines and outputs of the programming latches.

BRIEF DESCRIPTION OF THE DRAWINGS

These objects, characteristics and advantages as well as others of the present invention will be described with more details in the following description of an embodiment of a memory according to the invention, done in a non limiting way, in conjunction with the accompanying drawings, among which.

DETAILED DESCRIPTION OF THE PREFERRED EMBODIMENTS

Figure 1:
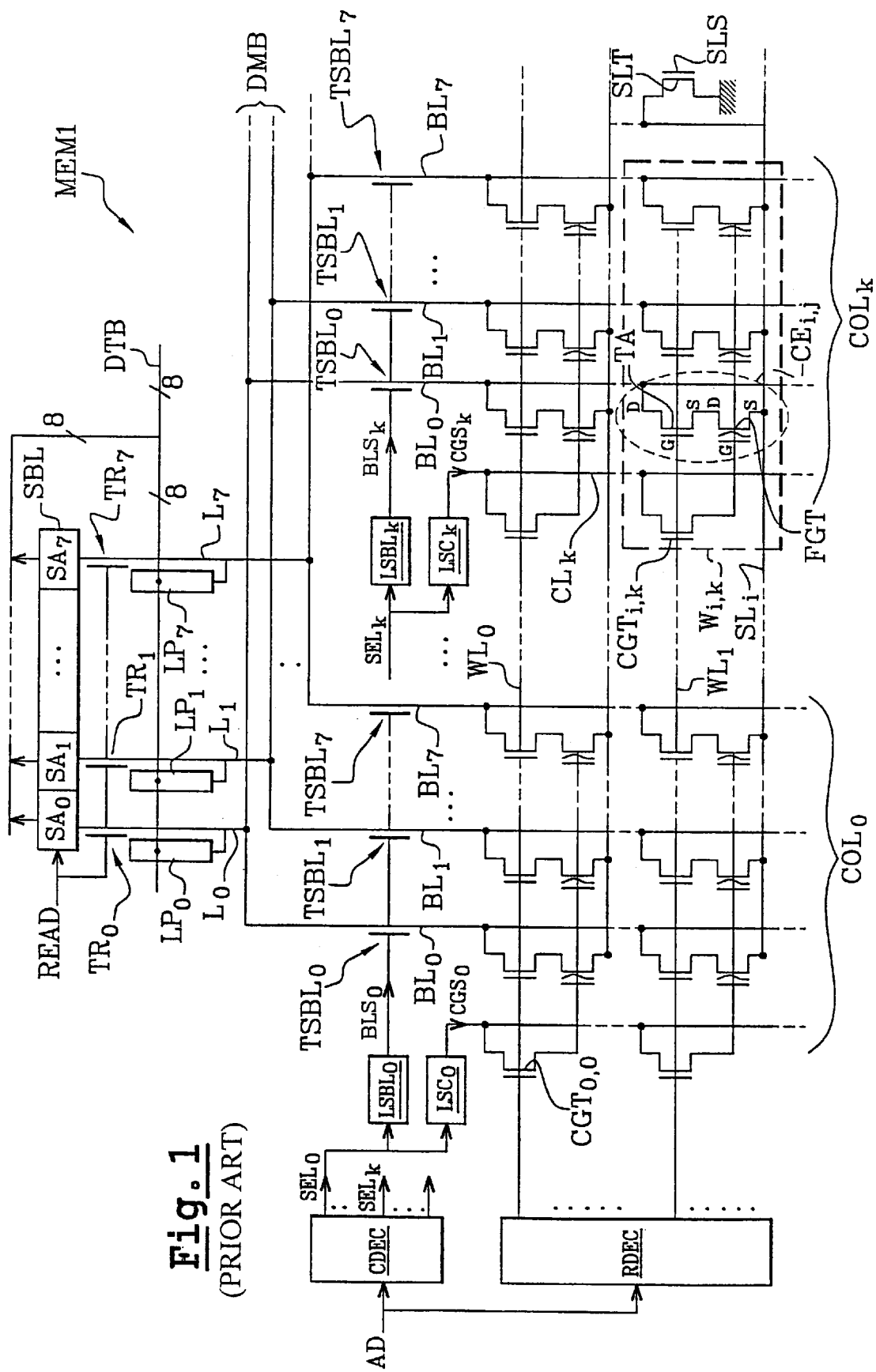
FIG. 1 shows an architecture of a word programmable EEPROM device according to the prior art.
Figure 2:
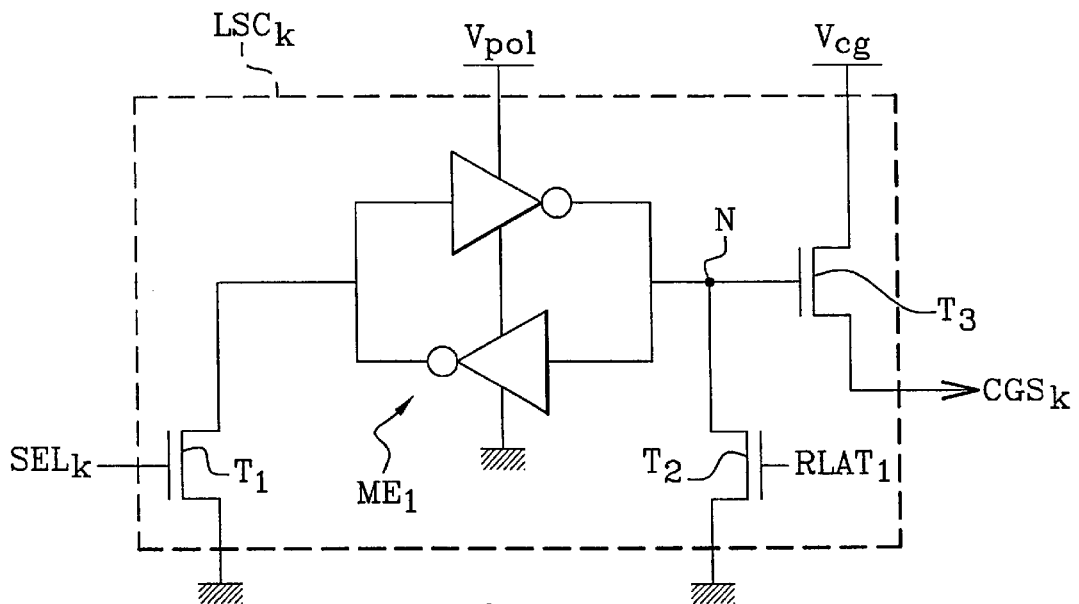
FIG. 2 shows a column selection latch in a word programmable EEPROM device according to the prior art.
Figure 3:
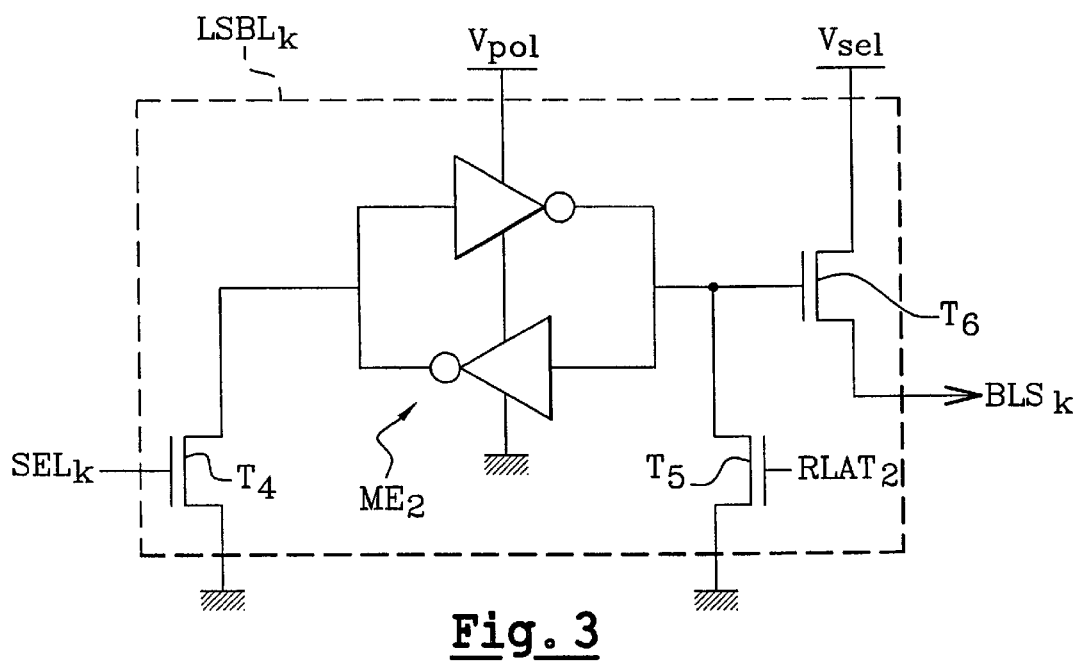
FIG. 3 shows a bit lines selection latch in a word programmable EEPROM memory according to the prior art.

FIG. 2 shows a conventional embodiment of a column selection latch $LSC_k$ and FIG. 3 shows a conventional embodiment of a bit lines selection latch LSBLk. These two elements are used in the memory MEM1 described above in relation with FIG. 1.

Column select latch $LSC_k$ comprises a locking element ME1 in the form of an inverting memory cell, formed by two inverting gates connected top to bottom and supplied with a voltage Vpol. The input of cell ME1 is coupled to ground by a NMOS transistor T1, the gate of which is driven by the column selection signal $SEL_k$ delivered by column decoder CDEC (FIG. 1). The output of memory cell ME1 is coupled to ground by a NMOS transistor T2, the gate of which is driven by a reset signal RLAT1 (Reset Latch). The output of memory cell ME1 drives the gate of a NMOS transistor T3 receiving on its drain a gate control voltage Vcg, and delivers on its source the gate control signal $CGS_k$ described above. This signal is applied to floating gate transistors FGT by a gate control transistor $CGT_{i,k}$ (FIG. 1).

Bit lines selection latch $LSBL_k$ comprises a locking element ME2. Locking element ME2 is an inverting memory cell formed by two inverting gates connected top to bottom and supplied with a voltage Vpol. The input of cell ME2 is coupled to ground by a NMOS transistor T4, the gate of which is driven by column selection signal $SEL_k$. The output of memory cell ME2 is coupled to ground by a NMOS transistor T5, the gate of which is driven by a reset signal RLAT2. The output of memory cell ME2 drives the gate of a NMOS transistor T6 receiving on its drain a voltage Vsel. Transistor T6 delivers on its source a bit lines selection signal $BLS_k$ applied to bit lines selection transistors TSBL0 to TSBL7 (FIG. 1).

During erasing phases of memory cells, voltages Vpol and Vcg are equal to Vpp, and voltage Vsel is equal to zero. During programming phases, voltages Vpol and Vsel are equal to Vpp, and voltage Vcg is equal to zero. During reading phases, voltages Vpol and Vsel are equal to a voltage Vcc, which is generally the memory supply voltage, and voltage Vcg is chosen substantially equal to a reading voltage Vread.

To simplify the architecture of a word programmable EEPROM memory, the present invention provides the integration of the two latches $LSC_k$ and $LSBL_k$ into one latch comprising an input for receiving selection signal $SEL_k$ and two outputs for respectively delivering the gate control signal $CGS_k$ and the bit lines selection signal $BLS_k$.

Figure 4:
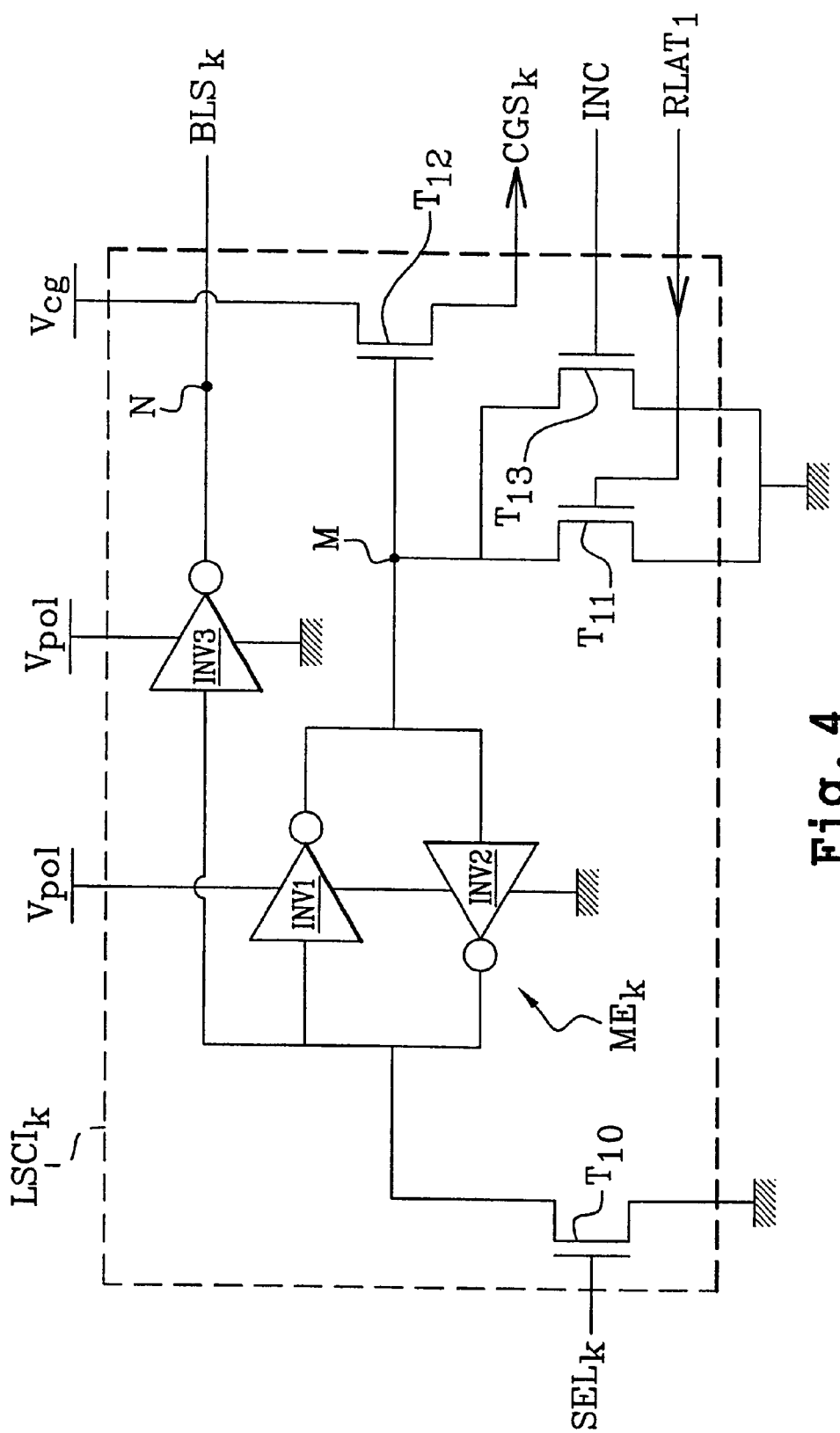
FIG. 4 shows a column selection latch according to the present invention.

FIG. 4 shows an embodiment of a latch $LSCI_k$ according to the invention. Latch $LSCI_k$ comprises a locking element $ME_k$ having, for example, the form of an inverting memory cell formed by two inverting gates INV1, INV2 connected top to bottom and supplied with a voltage Vpol. The input of cell $ME_k$ is coupled to ground by a NMOS transistor T10, the gate of which is driven by column selection signal $SEL_k$. Thus, when signal $SEL_k$ passes to 1, the output of cell $ME_k$ passes also to 1. The output of cell $ME_k$ is coupled to ground of a NMOS transistor T11, the gate of which is driven by a reset signal RLAT. Furthermore, the output of memory cell $ME_k$ drives the gate of a NMOS transistor T12 receiving on its drain the gate control voltage Vcg. Transistor T12 delivers on its source the gate control signal $CGS_k$. According to the invention, the input of cell $ME_k$ is connected to the input of an inverting gate INV3 supplied with voltage Vpol, the output of which delivers the bit lines selection signal $BLS_k$.

Optionally, latch $LSCI_k$ comprises also a NMOS transistor T13 arranged in parallel with transistor T11 and driven by a signal INC. This signal INC, different from signal RLAT, allows a cascade reset of latches arranged in various columns during a sequential reading of a whole page of the memory, with a scanning of the column addresses.

Figure 5:
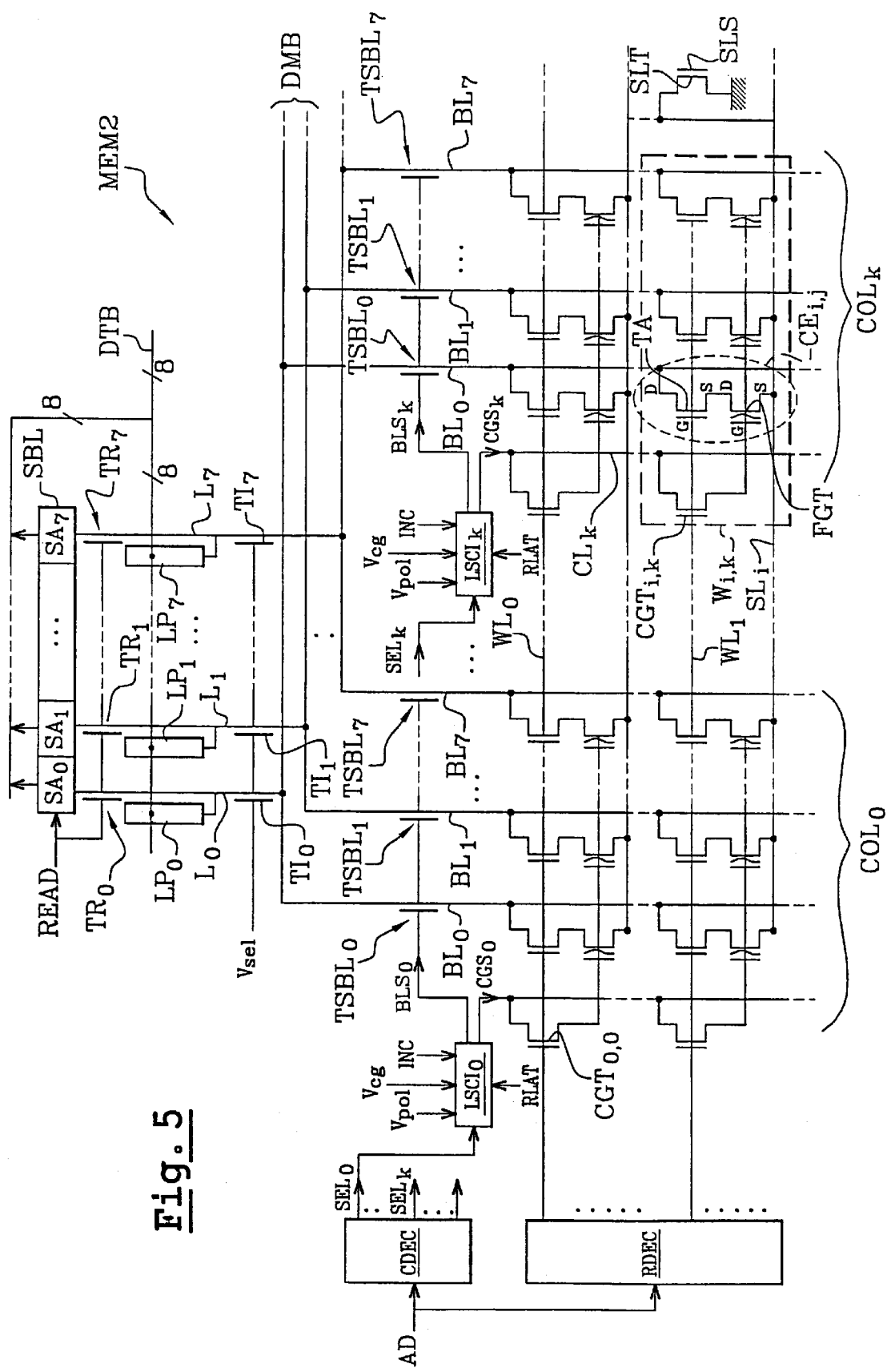
FIG. 5 shows an architecture of a word programmable EEPROM device comprising column selection latches according to the present invention, FIGS. 6A, 6B and 6C respectively show electrical voltages appearing in the memory according to the present invention during erasing, programming and reading phases.

FIG. 5 shows a memory MEM2 incorporating latches $LSCI_k$ according to the invention. Memory MEM2 has in a general way the same structure as the memory MEM1 of FIG. 1 and will not be described again, with the various elements being designated by the same references.

Memory MEM2 distinguishes from the conventional memory MEM1 by the fact that the column selection latches $LSC_k$ as well as the bit lines selection latches $LSBL_k$ are suppressed and replaced by latches $LSCI_k$ according to the invention. Latches $LSCI_k$ deliver in each column the gate control signal $CGS_k$ and the bit lines selection signal $BLS_k$.

Memory MEM2 also comprises eight insulating transistors TI0 to TI7 arranged on the lines L0 to L7 downstream from the outputs of programming latches LP0 to LP7 and upstream from the demultiplex bus DMB. The gates of the insulating transistors are driven by the voltage Vsel mentioned above in relation to FIG. 3.

Figure 6A:
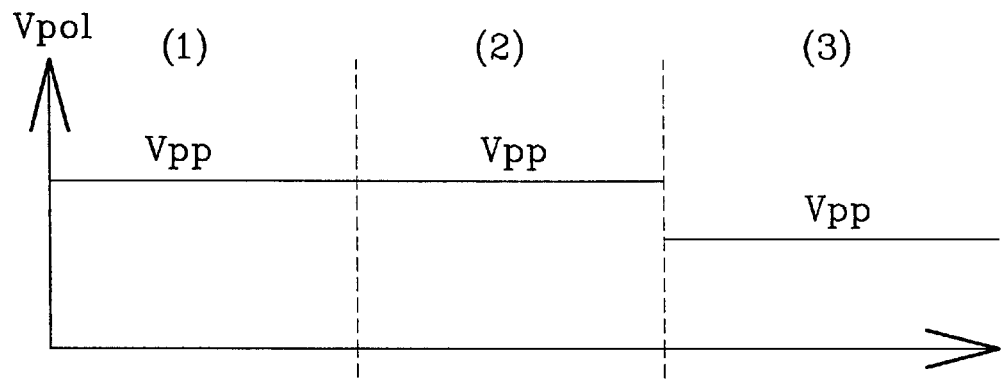
Figure 6B:
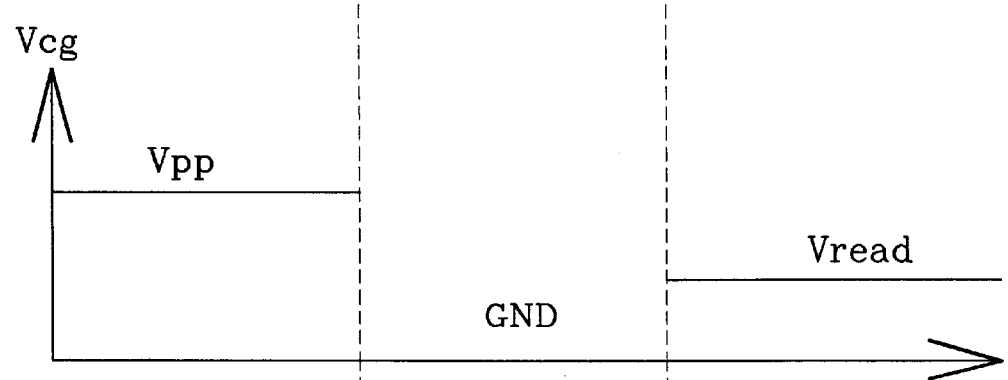
Figure 6C:
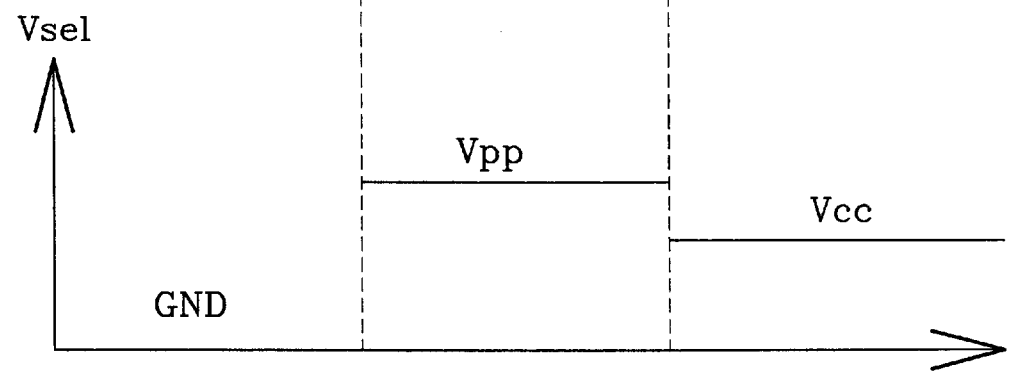

FIGS. 6A, 6B and 6C respectively show the values of the voltages Vpol, Vcg and Vsel during the erasing (1), programming (2) and reading (3) phases. During the erasing phases, voltages Vpol and Vcg are equal to the high voltage Vpp and voltage Vsel is at zero (ground). During the programming phases (2), voltages Vpol and Vsel are equal to the high voltage Vpp, and voltage Vcg is at zero. During the reading phases (3), voltages Vpol and Vsel are equal to the memory supply voltage Vcc, and voltage Vcg is equal to the reading voltage Vread.

Memory MEM2 operates as follows. During an erasing phase of the memory cells of a word $W_{i,k}$, the corresponding word line $WL_i$ is brought to voltage Vpp by decoder RDEC. The latch $LSCI_k$ of the column $COL_k$ is activated by the signal $SEL_k$ delivered by decoder CDEC, and delivers a gate control signal $CGS_k$ and a bit lines selection signal $BLS_k$ equal to Vpp. When the selection transistors $TSBL_k$ is turned ON, the insulation of the bit lines $BL_j$ in relation to the outputs of programming latches $LP_j$ is ensured by the insulating transistors $TI_j$ because voltage Vsel is equal to zero. In parallel, source line $SL_i$ is connected to ground by transistor SLT. The floating gate transistors FGT of word $W_{i,k}$ receive the erasing voltage Vpp on their gate by the gate control transistor $CGT_{i,k}$ and their source is brought to ground, causing an extraction of the charges trapped in the floating gates and the erasing of transistors FGT.

During a programming phase of the memory cells of a word $W_{i,k}$, the programming latches LP0 to LP7 deliver a programming high voltage Vpp or a voltage equal to zero, according to the value of the bits which have been loaded before therein by the data bus DTB. Word line $WL_i$ is brought to voltage Vpp by decoder RDEC. Latch $LSCI_k$ is activated by signal $SEL_k$ and delivers again a gate control signal $CGS_k$ and a bit lines selection signal $BLS_k$ equal to Vpp. The transistors $TSBL_j$ of the column and insulating transistors $TI_j$ let pass the voltage Vpp delivered by the programming latches in the bit lines of the column. The floating gate transistors FGT have their gates brought to ground by the gate control transistor $CGT_{i,k}$ of the word $W_{i,k}$ (Vcg=0). Source line $SL_i$ is brought to a floating potential. Transistors FGT receive thus on their drain the voltage Vpp or the zero voltage delivered by a programming latch, and those which receive voltage Vpp are programmed by the Fowler-Nordheim effect and injection of charges in their floating gate.

During a reading phase of the memory cells of a word $W_{i,k}$, latch $LSCI_k$ is activated by selection signal $SEL_k$ and delivers a gate control signal $CGS_k$ equal to Vread (Vcg=Vread) and a bit lines selection signal $BLS_k$ equal to Vcc (Vpol=Vcc). The transistors $TSBL_j$ of the column are thus turned ON and let pass the voltage Vcc delivered by the sense amplifiers SA0 to SA7 in the concerned bit lines. Word line $WL_i$ is brought to voltage Vcc by decoder RDEC. Source line $SL_i$ is brought to ground. The floating gate transistors of word $W_{i,k}$ have their gate brought to voltage Vread by gate control transistor $CGT_{i,k}$ and their state ON or OFF is detected by the sense amplifiers SA0 to SA7.

The present invention is of course likely to have various alternative embodiments. First, as illustrated in FIG. 4, a node N at the output of inverting gate INV3 shows the same logic value 1 (Vpol) or 0 (ground) as a node M at the output of inverting cell $ME_k$. Thus, in an alternative embodiment, signal $BLS_k$ can be taken directly at node M by a conductive track. However, since signal $BLS_k$ is applied to eight transistors TSBL0 to TSBL7, the taking of this signal at the output of cell $ME_k$ requires an increase in the size of the transistors forming the gates INV1 and INV2 (not represented), so that cell $ME_k$ is capable of delivering enough current for simultaneously and rapidly charging the gate stray capacities of all the transistors. It has appeared simpler to the inventors to provide inverting gate INV3 connected to a node L located at the input of cell $ME_k$, as described above, without modifying the structure of cell $ME_k$ in relation to the conventional column selection latch.

In one embodiment of the memory according to the invention, the insulating transistors TI0 to TI7 are integrated in the programming latches LP0 to LP7 and are no more located on the path linking the bit lines to the inputs of the sense amplifiers. It is then no longer necessary, in the mode reading, to turn ON the insulating transistors.

Figure 7:
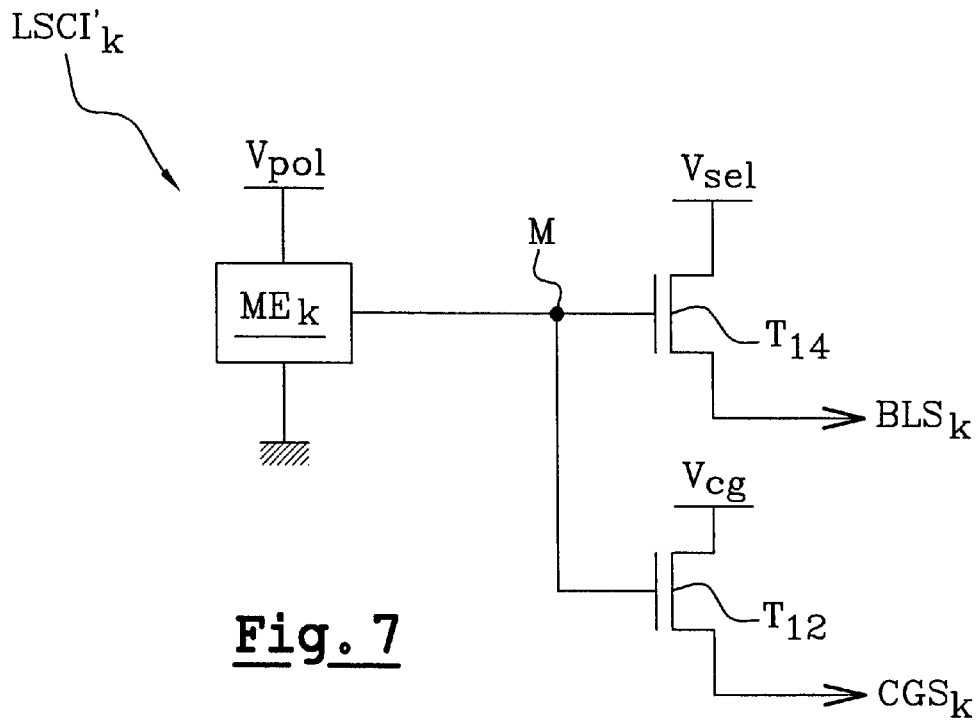
FIGS. 7 and 8 respectively show alternative embodiments of column selection latches according to the present invention.

In an embodiment of a latch $LSCI'_k$ according to the invention, represented in FIG. 7, the output of cell $ME_k$ drives, in addition to transistor T12 delivering the gate control signal $CGS_k$, a NMOS transistor T14 which receives, on its drain, voltage Vsel and delivers the bit lines selection signal $BLS_k$. In this embodiment, the bit lines selection signal $BLS_k$ is at zero (ground) during the erasing phases and the insulating transistors TI0 to TI7 are no longer necessary.

The latch $LSCI_k$ represented in FIG. 4 has, however, the advantage, when compared to the one of FIG. 7, of not receiving the voltage Vsel which is thus not used for generating the signal $BLS_k$ delivered by the latch. Signal $BLS_k$ is thus equal to Vpp during the erasing periods, and the bit lines selection transistors $TSBL_j$ are turned ON. This is compensated by the providing of the insulating transistors TI0 to TI7 driven by voltage Vsel, which are turned OFF during the erasing periods when voltage Vsel is equal to 0. The column selection latch $LSCI_k$ of FIG. 4 thus does not comprise a voltage Vsel switching transistor like the transistor T14 of the latch of FIG. 7.

This feature is advantageous when the number of latches $LSCI_k$ is greater than eight, which is generally the case, and allows the suppression of as much voltage Vsel switching transistors as latches $LSCI_k$ present in the memory. For example, there are 256 suppressed transistors (one for each latch $LSCI_k$) in a memory with 256 columns and 256 latches $LSCI_k$. However, the main advantage of the present invention lies in the suppression of the bit lines selection latches and of the locking elements that they comprise, and the embodiment of FIG. 7 is within the scope of the present invention.

Figure 8:
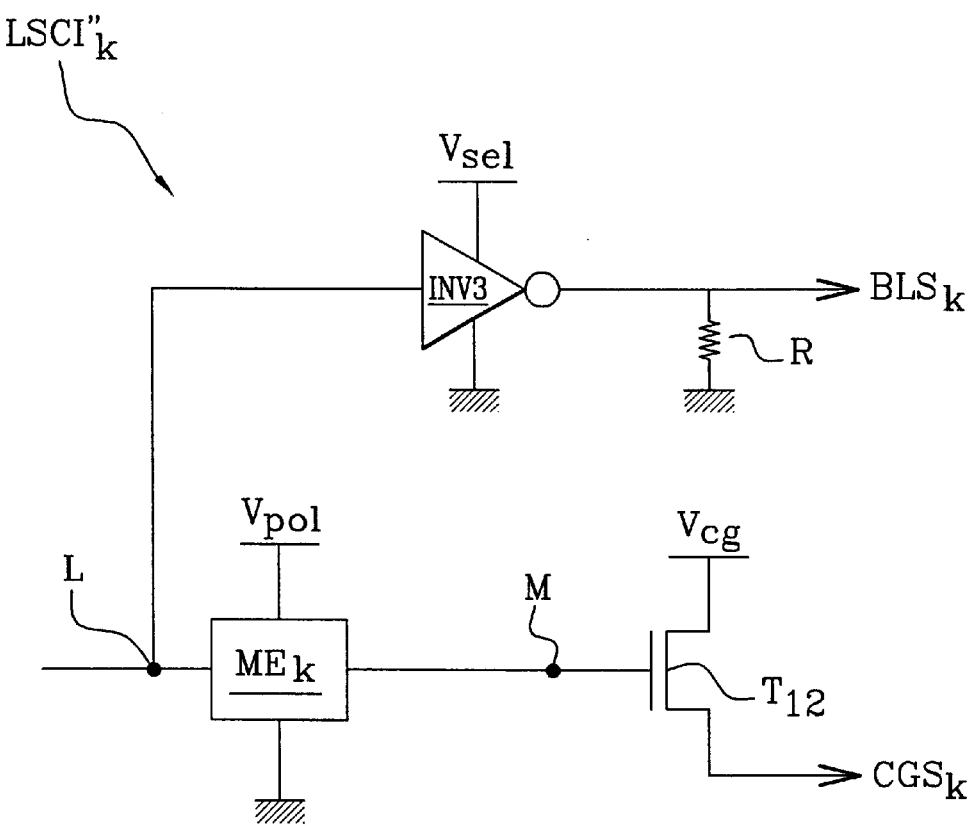

As another possible alternative, FIG. 8 shows a latch $LSCI''_k$ according to the invention, in which the inverting gate INV3 is supplied with voltage Vsel and has its output connected to ground by a pull-down resistor of high value. In this embodiment, the bit lines selection signal $BLS_k$ is also grounded during the erasing periods, because signal Vsel is at zero and gate INV3 is not electrically supplied. The insulating transistors TI0 to TI7 are also not necessary in this embodiment.

It will be clearly apparent to one skilled in the art that various other embodiments are possible to design a column latch according to the invention, the main characteristic of which is to deliver a gate control signal $CGS_k$ and a bit lines selection signal $BLS_k$ which are controlled by the output of one element $ME_k$ only, ensuring the locking of the column selection signal $SEL_k$.

That which is claimed is:

1. An electrically erasable and programmable memory comprising:

an array of memory cells arranged in rows and columns;

word lines connected to the rows of said array of memory cells;

bit lines connected to the columns of said array of memory cells;

a plurality of bit line selection transistors connected to said bit lines and being driven by bit line selection signals;

a column decoder for providing a plurality of column selection signals; and a plurality of column selection latches connected to said column decoder for receiving respective column selection signals, each column selection latch for delivering a gate control signal applied to memory cells of a respective column, and comprising a locking element for receiving the respective column selection signal, a switch connected to said locking element for setting a value of the gate control signal based upon an output of the locking element, the gate control signal being equal to an erasing high voltage during erasing periods of the memory cells, and a bit line selection element for delivering a respective bit line selection signal having a value based upon an output of said locking element during programming and reading periods of the memory cells of the respective column, the bit line selection signal being substantially equal to the erasing high voltage during the erasing periods of the memory cells.

2. An electrically erasable and programmable memory according to claim 1, wherein each column selection latch delivers, in an active state during the programming periods of the memory cells, the gate control signal being equal to zero and the bit line selection signal being substantially equal to a programming high voltage.

3. An electrically erasable and programmable memory according to claim 1, further comprising:

a plurality of programming latches; and a plurality of insulating transistors connected between said bit lines and said plurality of programming latches.

4. An electrically erasable and programmable memory according claim 1, wherein said switch comprises a transistor comprising a control terminal connected to an output of said locking element, an input conduction terminal for receiving a gate control voltage, and an output conduction terminal for delivering the gate control signal.

5. An electrically erasable and programmable memory according to claim 1, wherein each column selection latch further comprises a conductive path having a first end connected to an output of said locking element and a second end for delivering the bit line selection signal.

6. An electrically erasable and programmable memory according to claim 1, wherein said bit line selection element comprises a transistor having a control terminal connected to an output of said locking element, an input terminal for receiving a predetermined voltage, and an output terminal for delivering the bit line selection signal.

7. An electrically erasable and programmable memory according to claim 6, wherein the predetermined voltage is equal to a supply voltage applied to said locking element.

8. An electrically erasable and programmable memory according to claim 6, wherein the predetermined voltage is equal to zero during erasing phases of the memory cells.

9. An electrically erasable and programmable memory according claim 1, wherein said bit line selection element comprises an inverting gate electrically supplied with a predetermined voltage, and having an input connected to an input of said locking element and an output for delivering the bit line selection signal.

10. An electrically erasable and programmable memory according to claim 9, wherein the predetermined voltage is equal to a supply voltage applied to said locking element.

11. An electrically erasable and programmable memory according to claim 9, wherein the predetermined voltage is equal to zero during erasing phases of the memory cells.

12. An electrically erasable and programmable memory comprising:

an array of memory cells arranged in rows and columns;

word lines connected to the rows of said array of memory cells;

bit lines connected to the columns of said array of memory cells;

a plurality of bit line selection transistors connected to said bit lines and being driven by bit line selection signals;

a plurality of programming latches;

a plurality of insulating transistors connected between said bit lines and said plurality of programming latches;

a column decoder for providing a plurality of column selection signals; and a plurality of column selection latches connected to said column decoder for receiving respective column selection signals, each column selection latch for delivering a gate control signal applied to memory cells of a respective column, and for delivering a respective bit line selection signal.

13. An electrically erasable and programmable memory according to claim 12, wherein each column selection latch comprises:

a locking element for receiving the respective column selection signal;

a switch connected to said locking element for setting a value of the gate control signal based upon an output of the locking element; and a bit line selection element for delivering the respective bit line selection signal having a value based upon an output said locking element.

14. An electrically erasable and programmable memory according claim 13, wherein said switch comprises a transistor comprising a control terminal connected to an output of said locking element, an input conduction terminal for receiving a gate control voltage, and an output conduction terminal for delivering the gate control signal.

15. An electrically erasable and programmable memory according to claim 13, wherein each column selection latch further comprises a conductive path having a first end connected to an output of said locking element and a second end for delivering the bit line selection signal.

16. An electrically erasable and programmable memory according to claim 13, wherein said bit line selection element comprises a transistor having a control terminal connected to an output of said locking element, an input terminal for receiving a predetermined voltage, and an output terminal for delivering the bit line selection signal.

17. An electrically erasable and programmable memory according claim 13, wherein said bit line selection element comprises an inverting gate electrically supplied with a predetermined voltage, and having an input connected to an input of said locking element and an output for delivering the bit line selection signal.

18. An electrically erasable and programmable memory according to claim 12, wherein each column selection latch delivers, in an active state during the programming periods of the memory cells, the gate control signal being equal to zero and the bit line selection signal being substantially equal to a programming high voltage.

19. An electrically erasable and programmable memory according to claim 12, wherein each column selection latch delivers, in an active state during erasing periods of the memory cells, the gate control signal being equal to an erasing high voltage and the bit line selection signal being equal to zero.

20. An electrically erasable and programmable memory according to claim 12, wherein each column selection latch delivers, in an active state during erasing periods of the memory cells, the gate control signal being equal to an erasing high voltage and the bit line selection signal being substantially equal to the erasing high voltage.

21. A method of selecting bit lines in an electrically erasable and programmable memory comprising an array of memory cells arranged in rows and columns, word lines connected to the rows, and bit lines connected to the columns of the array of memory cells, a plurality of bit line selection transistors connected to the bit lines, a column decoder, and a plurality of column selection latches connected to the column decoder, each column selection latch comprising a locking element and a conductive path connected to an output of the locking element, the method comprising:

delivering a column selection signal from the column decoder to a selected column selection latch and storing the column selection signal in the locking element associated therewith;

delivering a gate control signal from the selected column selection latch to memory cells of a respective column; and delivering a bit line selection signal from the conductive path connected to the output of the locking element associated with the selected column selection latch to bit lines of the respective column.

22. A method according to claim 21, wherein delivering the gate control signal is based upon an output of the locking element.

23. A method according to claim 22, wherein each column selection latch comprises a transistor having a control terminal connected to an output of the locking element, an input terminal for receiving a predetermined voltage, and an output terminal for delivering the bit line selection signal.

24. A method according to claim 21, wherein each column selection latch delivers, in an active state during programming periods of the memory cells, the gate control signal being equal to zero and the bit line selection signal being substantially equal to a programming high voltage.

25. A method according to claim 21, wherein each column selection latch delivers, in an active state during erasing periods of the memory cells, the gate control signal being equal to an erasing high voltage and the bit line selection signal being equal to zero.

26. A method according to claim 21, wherein each column selection latch delivers, in an active state during erasing periods of the memory cells, the gate control signal being equal to an erasing high voltage and the bit line selection signal being substantially equal to the erasing high voltage.

27. A method according to claim 21, wherein each column selection latch comprises a transistor comprising a control terminal connected to an output of the locking element, an input conduction terminal for receiving a gate control voltage, and an output conduction terminal for delivering the gate control signal.

28. A method according claim 21, wherein each column selection latch comprises an inverting gate electrically supplied with a predetermined voltage, and having an input connected to an input of the locking element and an output for delivering the bit line selection signal.

29. A method according to claim 21, further comprising:

providing a plurality of programming latches; and providing a plurality of insulating transistors between the bit lines and the plurality of programming latches.

* * * * *